(12) United States Patent
Stachurski

(10) Patent No.: US 7,386,444 B2
(45) Date of Patent: *Jun. 10, 2008

(54) HYBRID SPEECH CODING AND SYSTEM

(75) Inventor: Jacek Stachurski, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 806 days.

This patent is subject to a terminal disclaimer.

(21) Appl. No.: 10/769,501

(22) Filed: Jan. 30, 2004

(65) Prior Publication Data

US 2005/0065782 A1 Mar. 24, 2005

Related U.S. Application Data

(63) Continuation-in-part of application No. 09/668,396, filed on Sep. 22, 2000, now Pat. No. 7,222,070, and a continuation-in-part of application No. 09/668,398, filed on Sep. 22, 2000, now abandoned, and a continuation-in-part of application No. 09/668,844, filed on Sep. 22, 2000, now Pat. No. 7,039,581, and a continuation-in-part of application No. 09/668,846, filed on Sep. 22, 2000, now Pat. No. 7,139,700.

(51) Int. Cl.
*G10L 19/08* (2006.01)
*G10L 19/04* (2006.01)

(52) U.S. Cl. .............. 704/219; 704/205; 704/206; 704/208; 704/223; 704/231

(58) Field of Classification Search ............... 704/200, 704/201–210, 219–220, 224, 231–234
See application file for complete search history.

(56) References Cited

U.S. PATENT DOCUMENTS

| | | | | |
|---|---|---|---|---|
| 5,774,837 | A * | 6/1998 | Yeldener et al. | 704/208 |
| 5,828,996 | A * | 10/1998 | Iijima et al. | 704/220 |
| 6,226,604 | B1 * | 5/2001 | Ehara et al. | 704/207 |
| 6,233,550 | B1 * | 5/2001 | Gersho et al. | 704/208 |
| 6,434,519 | B1 * | 8/2002 | Manjunath et al. | 704/205 |
| 2004/0054526 | A1 * | 3/2004 | Chazan et al. | 704/206 |
| 2004/0204935 | A1 * | 10/2004 | Anandakumar et al. | 704/230 |

OTHER PUBLICATIONS

Choy, Eddie L. T. "Waveform Interpolation Speech Coder at 4 kb/s." Thesis. McGill University. Published Aug. 1998 [Retrieved Nov. 17, 2007]. Retrieved from <http://www-mmsp.ece.mcgill.ca/MMSP/Theses/1998/ChoyT1998.pdf>.*

* cited by examiner

*Primary Examiner*—Talivaldis Ivars Smits
*Assistant Examiner*—David Kovacek
(74) *Attorney, Agent, or Firm*—Frederick J. Telecky, Jr.; Wade J. Brady, III; Mirna G. Abyad

(57) ABSTRACT

Hybrid linear predictive speech coding system with phase alignment predictive quantization zero phase alignment of speech prior to waveform coding aligns synthesized speech frames of a waveform coder with frames synthesized with a parametric coder. Inter-frame interpolation of LP coefficients suppresses artifacts in resultant synthesized speech frames.

2 Claims, 5 Drawing Sheets

US 7,386,444 B2

HYBRID SPEECH CODING AND SYSTEM

RELATED APPLICATIONS

This application is a continuation-in-part of Appl. Nos. 09/668,396, 09/668,398, 09/668,844, and 09/668,846, all filed 09/22/2000. The following cofiled patent applications disclose related subject matter: Appl. Nos. 10/769,243, 10/769,500, and 10/769,696. These applications have a common assignee with the present application.

BACKGROUND OF THE INVENTION

The present invention relates to electronic communications, and more particularly to digital speech coding methods and circuitry.

The performance of digital speech systems using low bit rates has become increasingly important with current and foreseeable digital communications. One digital speech method, linear prediction (LP), models the vocal track as a filter with an excitation to mimic human speech. In this approach only the parameters of the filter and the excitation of the filter are transmitted across the communication channel (or stored), and a synthesizer regenerates the speech with the same perceptual characteristics as the input speech. Periodic updating of the parameters requires fewer bits than direct representation of the speech signal, so a reasonable LP vocoder can operate at bits rates as low as 2-3 Kb/s (kilobits per second), whereas the public telephone system uses 64 Kb/s (8-bit PCM codewords at 8,000 samples per second).

A speech signal can be roughly divided into voiced and unvoiced regions. The voiced speech is periodic with a varying level of periodicity, but the unvoiced speech does not display any apparent periodicity and has a noisy character. Transitions between voiced and unvoiced regions as well as temporary sound outbursts (e.g., plosives like "p" or "t") are neither periodic nor clearly noise-like. In low-bit rate speech coding, applying different techniques to various speech regions can result in increased efficiency and perceptually more accurate signal representation. In coders which use linear prediction, the linear LP-synthesis filter is used to generate output speech. The excitation for the LP-synthesis filter models the LP-analysis residual to maintain speech characteristics: it is periodic for voiced speech, noise-like for unvoiced segments, and neither for transitions or plosives.

In a Code Excited Linear Prediction (CELP) coder, the LP excitation is generated as a sum of a pitch synthesis-filter output (sometimes implemented as an entry in an adaptive codebook) and a innovation sequence. The pitch-filter (adaptive codebook) models the periodicity of voiced speech. Sparse codebooks can efficiently encode pulses in tracks for excitation synthesis; see Peng et al, U.S. Pat. No. 6,236,960. The unvoiced segments are generated from a fixed codebook which contains stochastic vectors. The codebook entries are selected based on the error between input (target) signal and synthesized speech making CELP a waveform coder. T. Moriya and M. Honda, Speech Coder Using Phase Equalization and Vector Quantization, Proc. IEEE ICASSP 1701 (1986) and U.S. Pat. No. 4,850,022, describe a phase equalization filtering to take advantage of perceptual redundancy in slowly varying phase characteristics and thereby reduce the number of bits required for coding.

In Mixed Excitation Linear Prediction (MELP) coder, the LP excitation is encoded as a superposition of periodic and non-periodic components. The periodic part is generated from waveforms, each representing a pitch period, encoded in the frequency domain. The non-periodic part consists of noise generated based on signal correlations in individual frequency bands. The MELP-generated voiced excitation contains both (periodic and non-periodic) components while the unvoiced excitation is limited to the non-periodic component. The coder parameters are encoded based on an error between parameters extracted from input speech and parameters used to synthesize output speech making MELP a parametric coder. The MELP coder, like other parametric coders, is very good at reconstructing the strong periodicity of steady voiced regions. It is able to arrive at a good representation of a strongly periodic signal quickly and adjusts well to small variations present in the signal. It is, however, less effective at modeling non-periodic speech segments like transitions, plosive sounds, and unvoiced regions. The CELP coder, on the other hand, by matching the target waveform directly, seems to do better than MELP at representing irregular features of speech. CELP is capable of maintaining strong signal periodicity but, at low bit-rates it takes longer to "build up" a good representation of periodic speech. A CELP coder is also less effective at matching small variations of strongly periodic signals.

Combining a parametric coder with a waveform coder generates problems of making the two work together. In known methods, the initial phase (time-shift) of the parametric coder is estimated based on past samples of the synthesized signal. When the waveform coder is to be used, its target-vector is shifted based on the drift between synthesized and input speech. The solution works well for some types of input but it is not robust: it may easily break when the system attempts to switch frequently between coders, particularly in voiced regions.

Gersho et al, U.S. Pat. No. 6,233,550, provide a hybrid coder with three speech classifications and coding models: steady-state voiced (harmonic), stationary unvoiced (noise-like), and "transitory" or "transition" speech.

However, the speech output from such hybrid coders at about 4 kb/s is not yet an acceptable substitute for toll-quality speech in many applications

SUMMARY OF THE INVENTION

The present invention provides hybrid linear predictive (LP) speech coding methods and systems with a second alignment phase encoding in a transitional frame.

This has advantages including higher performance in a hybrid speech coder.

DESCRIPTION OF THE PREFERRED EMBODIMENTS

1. Overview

Figure 2A:
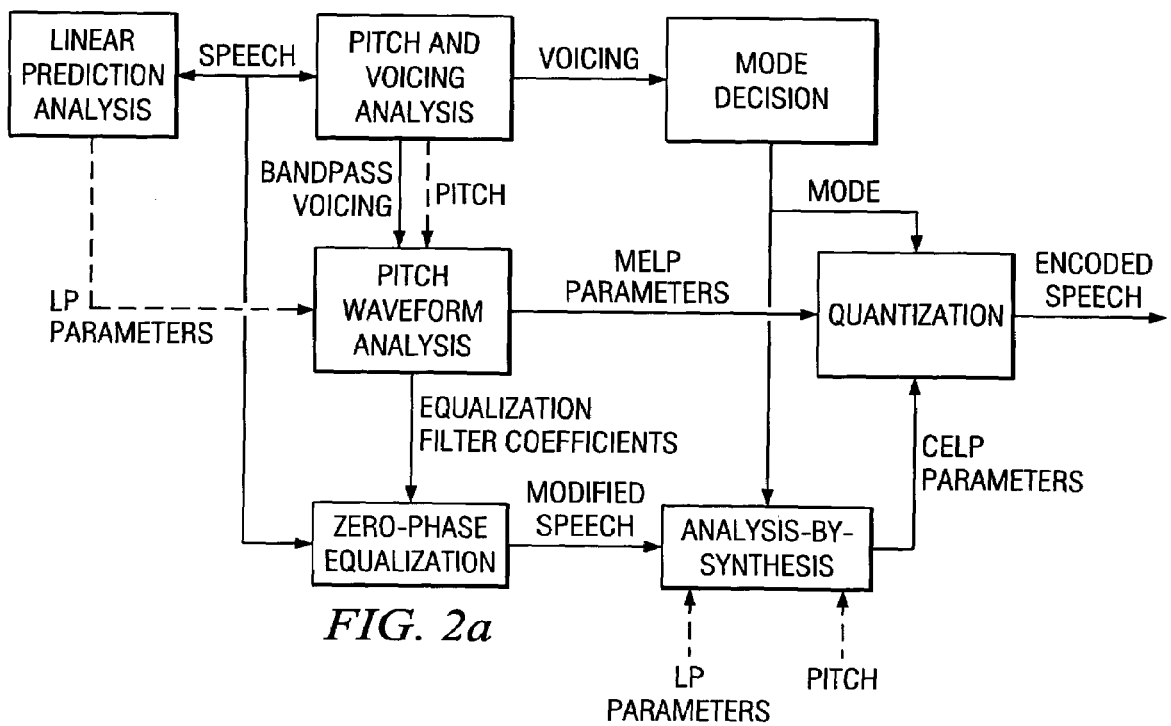
FIGS. 2a-2b show functional blocks of preferred embodiment system encoder and decoder.
Figure 2B:
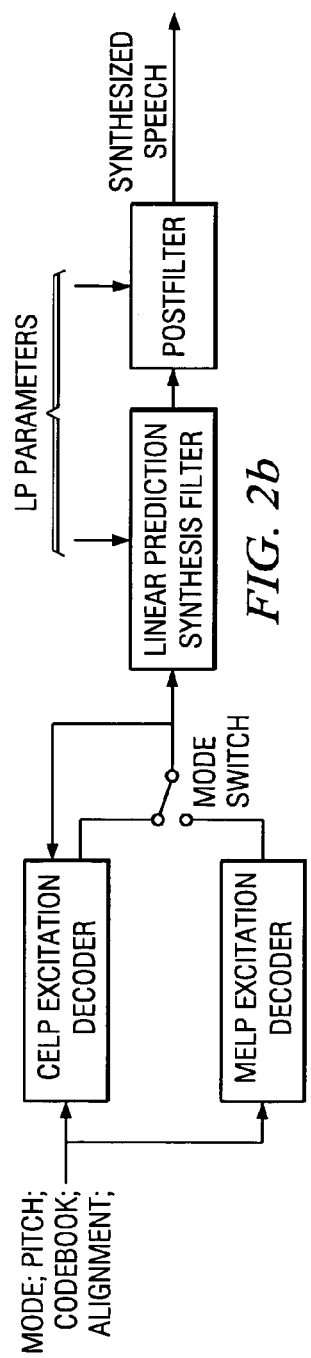
Figure 3:
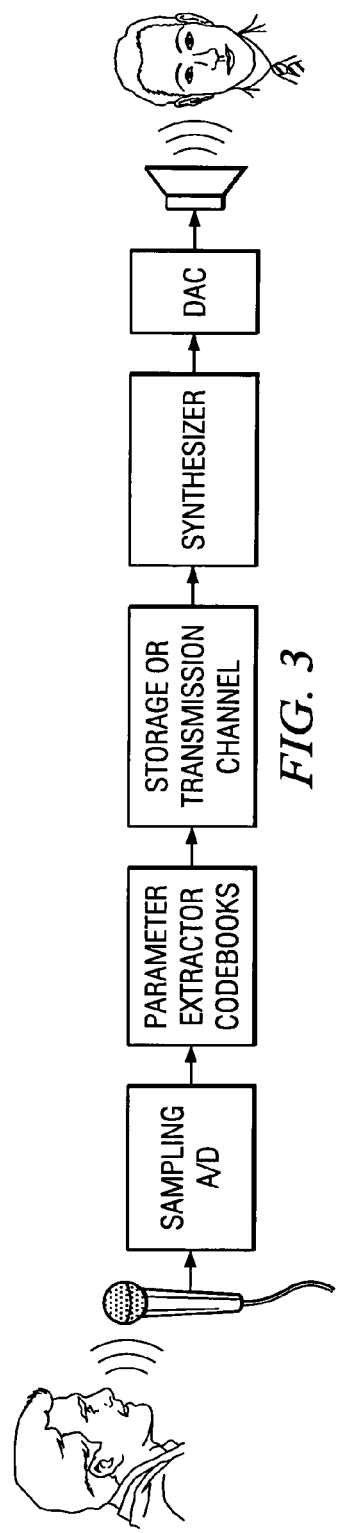
FIG. 3 shows an overall system.

Preferred embodiment LP speech coding methods provide one or more of LSF coding with interpolation factors, simple optimal algebraic codebook access, enhanced alignment phase coding for transition frames, and bandpass adjustment of zero-phase equalization filter coefficients. FIGS. 1a-1e are flow diagrams for these methods. These methods could be used individually or in groups in speech coders, and more particularly, as aspects of hybrid digital speech coding systems with functional block encoders and decoders as illustrated in FIGS. 2a-2b, respectively. FIG. 3 illustrates an overall system.

2. Preferred Embodiment Hybrid Encoder and Decoder

The preferred embodiment hybrid encoder of FIG. 2a has the following functional blocks and operation (following sections contain details of the preferred embodiment methods which appear in the functional blocks in various combinations). Input digital speech (sampling rate of 8 kHz) is partitioned into 160-sample frames. The Linear Prediction Analysis block performs standard linear prediction (LP) analysis using a Hamming window of 200 samples centered at the end of a 160-sample frame (thus extending into the next frame). The LP parameters are calculated and transformed into line spectral frequency (LSF) parameters.

Pitch and Voicing Analysis block estimates the pitch (pitch period, pitch lag) for a frame from cross-correlations of a lowpass-filtered version of the frame of speech. Interpolations may be used to refine an integer pitch period estimate to fractional sample intervals; pitch typically falls into the range 18 to 132 samples (corresponding to pitch frequencies from 444 down to 61 Hz). Also, the frame is filtered into frequency bands (typically two to five bands, such as 0-500 Hz, 500-1000 Hz, 1000-2000 Hz, 2000-3000 Hz, and 3000-4000 Hz) and the strength of cross-correlations of speech offset by the pitch period within a band determines the bandpass voicing level for the band and thus whether the LP excitation should be periodic (voiced) or white noise (unvoiced) in a particular band; that is, a mixed excitation (MELP).

Pitch Waveform Analysis block extracts individual pitch-pulse waveforms (i.e., one pitch period length intervals) from the LP residual every 20 samples (subframes) which are transformed into the frequency domain with a discrete Fourier transform. The waveforms are normalized, aligned, and averaged (smoothed) in the frequency domain. Zero-phase equalization filter coefficients are derived from the averaged Fourier coefficients. The Fourier magnitudes are taken from the smoothed Fourier coefficients corresponding to the end of the frame. The gain of the waveforms is smoothed with a median filter and down-sampled to two values per frame. The alignment phase is estimated once per frame (optionally twice for certain transitional frames) based on the linear phase used to align the extracted LP-residual waveforms. This alignment phase is used in the MELP decoder to preserve time synchrony between the synthesized and input speech. This time synchronization reduces switching artifacts between MELP and CELP coders.

Mode Decision block classifies each frame of input speech into one of three classes (modes): unvoiced (UV), weakly-voiced (WV), and strongly-voiced (SV). The frame classification is based on the overall voicing strength determined in the Pitch and Voicing Analysis block. Classify a frame with very weak voicing or when no pitch estimate is made as unvoiced, a frame in which a pitch estimate is not reliable or changes rapidly or in which voicing is not strong as weakly-voiced, and a frame for which voicing is strong and the pitch estimate is steady and reliable as strongly-voiced. For strongly-voiced frames, MELP quantization is performed in the Quantization block. For weakly-voiced frames, the CELP coder with pitch predictor and sparse (algebraic) codebook is employed. For unvoiced frames, the CELP coder with stochastic codebook (and no pitch predictor) is used. This classification focuses on using the periodicity of weakly-voiced frames which are not effectively parametrically coded to enhance the waveform coding by using a pitch predictor so the pitch-filter output looks more stochastic and may use a more effective codebook.

When MELP encoding is used, pitch-pulse waveforms are encoded as Fourier magnitudes plus alignment phase (although the alignment phase could be omitted), and the MELP parameters are quantized in Quantization block.

In the CELP mode, the target waveform is matched in the (weighted) time domain so that, effectively, both amplitude and phase are encoded. To limit switching artifacts between amplitude-plus-alignment-only MELP and amplitude-and-phase CELP coding, the Zero-Phase Equalization block modifies the CELP target vector to remove the signal phase component not encoded in MELP. The zero-phase equalization is implemented in the time domain as an FIR filter. The filter coefficients are derived from the smoothed pitch-pulse waveforms.

Analysis-by-Synthesis block is used by the CELP coder for weakly-voiced frames to encode the pitch, pitch-predictor gain, fixed-codebook contribution, and codebook gain. The initial pitch estimate is obtained from the pitch-and-voicing analysis. The fixed codebook is a sparse (algebraic) codebook with four pulses per 10 ms (80-sample) subframe. The pitch-predictor gain and the fixed excitation gain are quantized jointly by the Quantization block.

For unvoiced frames, the CELP coder encodes the LP-excitation using a stochastic codebook with 5 ms (40-sample) subframes. Pitch prediction is not used in this mode. For both weakly-voiced and unvoiced frames, the target waveform for the analysis-by-synthesis procedure is the zero-phase-equalization-filtered speech (modified speech) from the Zero-Phase Equalization block. For frames for which MELP encoding is chosen, the MELP LP-excitation decoder is run to properly maintain the pitch delay buffer and the analysis-by-synthesis filter memories.

The preferred embodiment hybrid decoder of FIG. 2b has the following functional blocks and operation. In the MELP Excitation Decoder block the Fourier magnitudes are mixed with spectra obtained from white noise. The relative signal references are determined by the bandpass voicing strengths. Use the mixed Fourier spectra, pitch, and alignment phase to synthesize a time-domain signal. The gain-scaled time-domain signal forms the MELP LP-excitation.

CELP Excitation Decoder block for weakly-voiced mode frames generates an excitation by the sum of scaled samples of the prior frame excitation plus the scaled pulse-codebook contribution from a sparse (algebraic) codebook. For unvoiced mode frames, it generates the excitation from scaled stochastic codebook entries.

The excitation is passed through a Linear Prediction Synthesis filter. The LP synthesis filter coefficients are decoded from the transmitted MELP or CELP parameters, depending upon the mode. The coefficients are interpolated in the LSF domain with 2.5 ms (20-sample) subframes.

Postfilter with coefficients derived from LP parameters provides a boost to enhance the synthesized speech.

The bit allocations for the preferred embodiment coders for a 4 kb/s system (80 bits per 20 ms, 160-sample frame) could be:

| Parameter | SV frame | WV frame | UV frame |
|---|---|---|---|
| LSFs | 29 | 19 | 19 |
| Frame gain | 8 | 5 | 5 |

-continued

| Parameter | SV frame | WV frame | UV frame |
|---|---|---|---|
| Pitch | 8 | 6 | 4 |
| Bandpass voicing | 6 | — | — |
| Fourier magnitudes | 21 | — | — |
| Alignment phase | 6 | — | — |
| Fixed codebook | — | 40 | 45 |
| Subframe gains | — | 8 | 5 |
| MELP/CELP flag | 1 | 1 | 1 |
| Parity bits | 1 | 1 | 1 |

In particular, the LP parameters are coded in the LSF domain with 29 bits in a MELP frame and 19 bits in a CELP frame. Switched predictive multi-stage vector quantization is used. The same two codebooks, one weakly predictive and one strongly predictive, are used by both coders with one bit encoding the selected codebook. Each codebook has five stages with the bit allocation of 7, 6, 5, 5, 5. The MELP coder uses all five stages, while the CELP coder uses only the first three stages.

In the MELP coder, the gain corresponding to a frame end is encoded with 5 bits, and the mid-frame gain is coded with 3 bits. The coder uses 8 bits for pitch and 6 bits for alignment phase. The Fourier magnitudes are quantized with switched predictive multistage vector quantization using 21 bits. Bandpass voicing is quantized with 3 bits twice per frame.

In the CELP coder, one gain for a frame is encoded with 5 bits. The pitch lag is encoded with either 6 bits for weakly-voiced or 4 bits for unvoiced. In weakly-voiced mode, the CELP coder uses a sparse algebraic codebook with four pulses on tracks for each 80-sample (10 ms) subframe, and the eight pulses per 20 ms frame are encoded with 40 bits. Two pitch prediction gains and two normalized fixed-codebook gains are jointly quantized with 5 bits per frame. In unvoiced mode, the CELP coder uses a stochastic codebook with 5 ms (40-sample) subframes which means four per frame; 10-bit codebooks with one sign bit are used for the total of 45 bits per frame. The four stochastic-codebook gains normalized by the overall gain are vector-quantized with 5 bits.

One bit is used to encode MELP/CELP selection. One overall parity bit protects common CELP/MELP bits.

The strongly-voiced frames coded with a MELP coder have an LP excitation as a mixture of periodic and non-periodic MELP components with the first being the dominant. The periodic part is generated from waveforms encoded in the frequency domain, each representing a pitch period. The non-periodic part is a frequency-shaped random noise. The noise shaping is estimated (and encoded) based on signal correlation-strengths in five frequency bands.

FIG. 3 illustrates an overall system. The encoding (and decoding) may be implemented with specialized hardware or programmable devices such as a digital signal processor (DSP) (e.g., TMS320C30 or TMS320C6xxx manufactured by Texas Instruments) which can be programmed to perform the analysis or synthesis essentially in real time, or a combination of specialized hardware and software.

The following sections provide more details.

3. LSF Coding Preferred Embodiments

Depending upon bit rate, the preferred embodiment hybrid methods encode the LP coefficients (LSF version) at both frame end and frame middle; the frame middle LSFs are encoded in the form of interpolation coefficients to interpolate the encoded (quantized) LSFs at frame end and frame beginning (prior frame end). In particular, for a $10^{th}$ order LP analysis let [qlsf1[1], qlsf1[2], . . . , qlsf1[10]] denote the quantized and encoded (codebook) vector of LSF coefficients at the end of the current frame, and let [qlsf0[1], qlsf0[2], . . . , qlsf0[10]] denote the corresponding vector at the end of the prior frame, which is the beginning of the current frame. The preferred embodiment methods split the LSFs into subsets, and each subset separately has a linear interpolation coefficient selected (by error minimization) from a set of available interpolation coefficients. The encoding of the middle of the frame LSFs translates into encoding how the LSFs are split into subsets and the interpolation coefficient for each subset. The number of bits allocated to the frame middle LSFs encoding determines the subset split and bit allocation to each subset. For example, with 5 bits allocated to encoding the 10-vector of middle of the frame LSFs denoted [lsf[1], lsf[2], . . . , lsf[10]], the LSFs are split into three subsets: {lsf[1], lsf[2]}, {lsf[3], lsf[4], lsf[5]}, and {lsf[6], lsf[7], lsf[8], lsf[9], lsf[10]} and 2 bits are allocated to each of the first two subsets and 1 bit allocated to the third subset. Two bits implies 4 available interpolation coefficients, and the preferred embodiment take these to be {0.2, 0.4, 0.6, 0.8}. Similarly, 1 bit implies 2 available interpolation coefficients which the preferred embodiments take as {0.3, 0.7}. For each subset an error minimization selects the interpolation coefficient to be used (and encoded). For example, with the first subset {lsf[1], lsf[2]} and 2 bits which translates to 4 coefficients {coeff4[0]=0.2, coeff4[1]=0.4, coeff4[2]=0.6, coeff4[3]=0.8}, the minimization is:

```
minError = MaxValue; // initialize with a large number
for (j = 0, j < 4, j++) // loop over 4 available coefficients for first subset
{ error = 0;
  for ( k = 1, k < 3, k++) // loop over the 2 lsfs within the first subset
  { interpolate[j] = (1.0 – coeff4[j]) * qlsf0[k] + coeff4[j] * qlsf1[k];
    error += (interpolate[j] – lsf[k]) * (interpolate[j] – lsf[k]);
  }
  if (error < minError)
  { minError = error;
    select = j;
  }
}
```

Alternative preferred embodiments use different error measurements, such as |interpolate[j]−lsf[k]| and/or weight the terms according to lsf coefficient order such as error+=(interpolates[*j*]−*lsf[k]*)*(interpolate[*j*]−*lsf[k]*)
  *weights[*k*];

where weights[k] could also depend upon the subset structure.

The following are preferred embodiment partitions into subsets and corresponding bit allocations for certain useful total bits:

| total bits | subsets | allocated bits |
|---|---|---|
| 1 | {lsf[1], ..., lsf[10]} | 1 bit |
| 4 | {lsf[1], lsf[2]} | 2 bits |
|   | {lsf[3], .., lsf[5]} | 1 bit |
|   | {lsf[6], ..., lsf[10]} | 1 bit |
| 5 | {lsf[1], lsf[2]} | 2 bits |
|   | {lsf[3], .., lsf[5]} | 2 bits |
|   | {lsf[6], .., lsf[10]} | 1 bit |
| 6 | {lsf[1], lsf[2]} | 2 bits |
|   | {lsf[3], .., lsf[5]} | 2 bits |
|   | {lsf[6], .., lsf[10]} | 2 bits |

-continued

| total bits | subsets | allocated bits |
|---|---|---|
| 7 | {lsf[1], lsf[2]} | 3 bits |
|  | {lsf[3], .., lsf[5]} | 2 bits |
|  | {lsf[6], .., lsf[10]} | 2 bits |
| 15 | {lsf[1]} | 3 bits |
|  | {lsf[2]} | 3 bits |
|  | {lsf[3],lsf[4]} | 3 bits |
|  | {lsf[5],lsf[6]} | 2 bits |
|  | {lsf[7],lsf[8]} | 2 bits |
|  | {lsf[9],lsf[10]} | 2 bits |
| 22 | {lsf[1]} | 3 bits |
|  | {lsf[2]} | 3 bits |
|  | {lsf[3]} | 3 bits |
|  | {lsf[4]} | 3 bits |
|  | {lsf[5],lsf[6]} | 3 bits |
|  | {lsf[7],lsf[8]} | 3 bits |
|  | {lsf[9],lsf[10]} | 2 bits |
|  | {lsf[11],lsf[12]} | 2 bits |

Note that the 22 bits case presumed a $12^{th}$ order LP analysis, whereas all the other cases presumed a $10^{th}$ order LP analysis.

The following are preferred embodiment sets of available interpolation coefficients depending on bits allocated (the default case of 0 bits reflects linear interpolation to the middle of the frame and is listed for comparison):

| allocated bits | interpolation coefficients |
|---|---|
| 0 | {0.5} |
| 1 | {0.3, 0.7} |
| 2 | {0.2, 0.4, 0.6, 0.8} |
| 3 | {0.0625, 0.1875, 0.3125, 0.4375, 0.5625, 0.6875, 0.8125, 0.9375} |

Of course, alternative interpolation coefficient sets are possible, for example, {0.25,0.75} for 1 bit and {0.111, 0.222, . . . , 0.888} for 3 bits.

The weights applied to compute the error allow for emphasis of interpolation accuracy for particular lsf[k]s. For example, with the subset {lsf[1], lsf[2]}, the set of weights, weight[1]=1.2, weight[2]=1, would emphasize lsf[1].

Figure 1A:
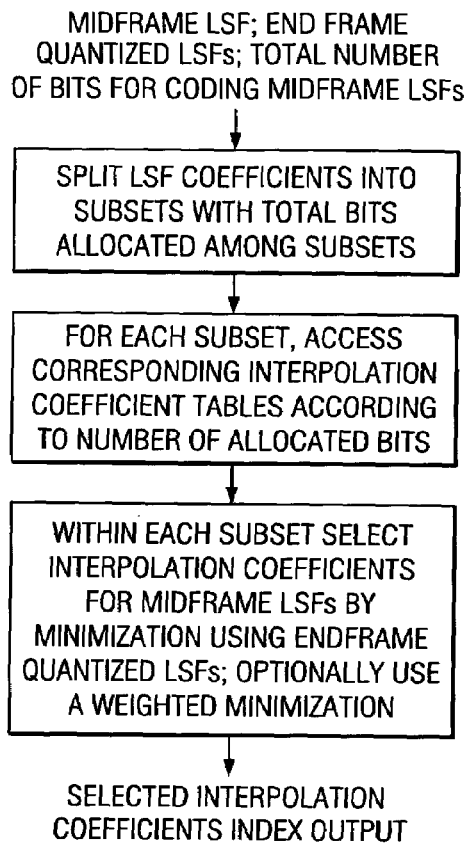
FIGS. 1a-1e are flow diagrams of preferred embodiments.

FIG. 1a is a flow diagram for the encoding.

4. Algebraic Codebook Preferred Embodiments

The excitation for the weakly-voiced frame CELP decoding is generated as a sum of a pitch synthesis-filter output (sometimes implemented as an entry in an adaptive codebook) plus a fixed innovation sequence from a fixed codebook; that is, $u(n)=g_p v(n)+g_c c(n)$ for n=0,1, . . . , 79 in a subframe with $g_p$ and $g_c$ gains, v(n) a pitch-shifted version of the prior excitation (adaptive codebook), and {c(n)} a sparse sequence of pulses from a fixed (algebraic) codebook. The codebook entries are selected based on the perceptually weighted error between input (modified) speech and output synthesized speech.

The innovation sequence, {c(n)}, can be efficiently represented with an algebraic codebook. Algebraic codebook entries contain a fixed number of non-zero pulses that are often limited to specified locations. A frame (block) of speech is subdivided into subframes which are further subdivided into tracks that specify allowable pulse positions. Such design facilitates efficient search for best pulse positions and subsequent encoding of the pulses.

Defining an algebraic codebook essentially consists of listing each possible combination of pulse positions and ± signs as a codebook entry and then assigning an index to each entry. An efficient codebook will use a minimal number of bits to encode the indices together with efficient methods of computing the index of a codebook entry (encoding) and determining the entry for an input index (decoding). A simple lookup table consumes too much memory; for example, 5 pulses distributed on 10 locations leads to over 38,000 combinations.

The preferred embodiment algebraic codebook methods roughly order the signed-pulse distributions (patterns) and assign an index to a distribution as equal to the number of other distributions which are larger; this allows efficient computations. In more detail, first consider the number of pulse location patterns and ± signs with the constraint that pulses do not overlap (at most one pulse in a position). Let C(n,m) denote the binomial coefficient n!/m!(n−m)!.

Then the number of distributions of P indistinguishable pulses (all same sign) without pulse overlap and within an N-position track is C(N,P), and so the number of such distributions with each pulse allowed to be either +1 or −1 is $C(N,P)2^P$. Next, count the number of pulse distributions with pulse overlap permitted as a sum over the number of track positions occupied by the pulses. In particular, the number of distributions of i occupied positions among the N positions is C(N,i); the number of distributions of P pulses allocated among the i positions with each position receiving at least one pulse is C(P−1,i−1) (i.e., C(P−i+i−1,i−1)); and the number of ± sign patterns under the constraint of all pulses at a position having the same sign is $2^i$. Thus the total number of distributions of signed pulses, denoted L(N,P), is $$L(N,P)=\Sigma_i C(N,i)C(P-1,i-1)2^i \text{ with the sum over } 1\leq i\leq P$$

Thus the example, L(10,5)=38,004. Note that the degenerate case L(N,0) may be taken as equal to 1 because there is only one distribution of no pulses.

Now define K(NP) as the number distributions of P pulses without regard to the sign of the pulse(s), if any, in position N; thus $$K(N,P)=L(N-1,0)+L(N-1,1)+L(N-1,2)+ \ldots +L(N-1,P)$$

where the term L(N−1,Q) counts the number of distributions with P−Q pulses (without sign) at position N and Q signed-pulses in the remaining positions 1,2, . . . N−1. Of course, the L(N−1,0) term corresponds to the one distribution of P unsigned pulses at position N and no pulses elsewhere.

Conversely, the L(N,P) can be recovered from the K(M, Q) as $$L(N,P)=2K(1,P-1)+2K(2,P-1)+ \ldots +2K(N,P-1,P)$$

where the term 2K(i,P−1) counts the distributions with at least one pulse at position i when i is the highest-numbered occupied position (the 2 factor accounts for the ± sign of the pulse(s) at position i).

The preferred embodiment encoding methods use the distribution counter K(M,Q) for encoding and decoding as follows. For a pulse distribution (codebook entry) of P pulses at positions $\{n_j\}$ where $N\geq n_1\geq n_2\geq \ldots \geq n_p\geq 1$ and with sign $1-2\sigma_j$ at $n_j$ where $\sigma_j$ is 0 or 1, compute the codebook index, $I_{CB}$, as a sum of pulse indices, $I_i$, one for each pulse:

$$I_{CB}=I_1+I_2+ \ldots +I_P$$

where the pulse indices are defined as:

$$I_1 = \sigma_1 K(n_1, P-1) + \Sigma_i 2K(i, P-1) \text{ for } n_1+1 \leq i \leq$$

$$I_2 = \sigma_2 K(n_2, P-2) + \Sigma_i 2K(i, P-2) + K(n_1, P-2) \text{ for } n_2+1 \leq i \leq n_1-1$$

$$I_P = \sigma_P K(n_P, 0) + \Sigma_i 2K(i, 0) + K(n_{P-1}, 0) \text{ for } n_P+1 \leq i \leq n_{p-1}-1$$

with the proviso that the pulse index for an overlapping pulse is ignored; that is, when $n_{j+1} = n_j$, set $I_{j+1} = 0$. See FIG. 1b.

The efficiency of the preferred embodiment methods of computing an index arises from the small number of values for K(M,Q) required. Indeed, the K(M,Q) values may be pre-computed and stored in a lookup table. For example, with the previously mentioned N=10 and P=5, which has 38,004 signed-pulse patterns, only 50 values of K(M,Q) are required for the index computations (M=1,2, . . . , 10 and Q=0,1, . . . ,4) and are set forth in the following table.

| | | | | | M | | | | | |
|---|---|---|---|---|---|---|---|---|---|---|
| Q | 1 | 2 | 3 | 4 | 5 | 6 | 7 | 8 | 9 | 10 |
| 0 | 1 | 1 | 1 | 1 | 1 | 1 | 1 | 1 | 1 | 1 |
| 1 | 1 | 3 | 5 | 7 | 9 | 11 | 13 | 15 | 17 | 19 |
| 2 | 1 | 5 | 13 | 25 | 41 | 61 | 85 | 113 | 145 | 181 |
| 3 | 1 | 7 | 25 | 63 | 129 | 231 | 377 | 575 | 833 | 1159 |
| 4 | 1 | 9 | 41 | 129 | 321 | 681 | 1289 | 2241 | 3649 | 5641 |

For smaller N and P a sub-table suffices and for larger N and P the table is augmented with columns and rows, respectively; the K(M,Q) values do not depend upon the size of the table. Also, the table is symmetric in that K(M,Q)=K(Q+1, M-1).

Geometrically, each pulse index $I_j$ is a sum of terms along row Q=P-j of the table from column $n_j$ to column $n_{j-1}$ with multipliers of $\sigma_j$, 2, or 1. The minimum index is 0 and occurs for all P pulses located at position N and with a + sign; whereas the maximum index is L(N,P)-1 and occurs for all P pulses located at position 0 and with a − sign.

As an encoding example with N=10 and P=5, consider the pulse pattern (codebook entry) of pulses located at positions $n_1=8$, $n_2=n_3=5$, $n_4=2$, $n_5=1$ and with signs corresponding to $\sigma_1=\sigma_2=\sigma_3=1$ and $\sigma_4=\sigma_5=0$. Then $$I_1 = \sigma_1 K(8,4) + 2K(9,4) + 2K(10,4) = 2241 + 2(3649) + (5641) = 20821$$

$$I_2 = \sigma_2 K(5,3) + 2K(6,3) + 2K(7,3) + K(8,3) = 129 + 2(231) + 2(377) + 575 = 1920$$

$$I_3 = 0 (n_3 = n_2),$$

$$I_4 = \sigma_4 K(2,1) + 2K(3,1) + 2K(4,1) + K(5,1) = 0 + 2(5) + 2(7) + 9 = 33,$$

$$I_5 = \sigma_5 K(1,0) + K(2,0) = 0 + 1 = 0.$$

Thus the index $I_{CB} = 20821 + 1920 + 0 + 33 + 1 = 22775$.

Intuitively, the distributions of signed pulses may be ordered by defining the ordering $\{n_j, \sigma_j\} \succ \{m_j, \tau_j\}$ when $n_1 > m_1$, or if $n_1 = m_1$ when $\sigma_1 < \tau_1$, or if $n_1 = m_1$ and $\sigma_1 = \tau_1$ when $n_2 > m_2$, or if . . . and so forth. Then the index $I_{CB}$ of $\{m_j, \tau_j\}$ equals the number of distributions $\{n_j, \sigma_j\}$ for which $\{n_j, \sigma_j\} \succ \{m_j, \tau_j\}$.

Of course, the interchange of + and − signs by using $2\sigma_j - 1$ yields an analogous method. Similarly, permuting the positions also gives analogous methods.

The preferred embodiment method of decoding a codebook index to recover the signed pulse pattern (codebook entry) for P pulses distributed on N locations is similarly simple: just decompose $I_{CB}$ by successively extracting $I_1$, $I_2$, . . . using the monotonic nature of the entries of the K(M,Q) table.

In particular, starting at 0, accumulate 2K(M, P−1) as M decreases from N until the index $I_{CB}$ is first equaled or exceeded, this picks out $n_1$: if the accumulation equals $I_{CB}$, then the decoding is complete and all pulses are at location $n_1$ equal to the next value of M and with a positive sign (all $\sigma_j = 0$); whereas, if $I_{CB}$ is exceeded, then $n_1 = M$. Next, determine $\sigma_1$ (and thus $I_1$) by whether $I_{CB}$ was exceeded by more than, exactly, or less than $K(n_1, P-1)$: if the accumulation exceeded $I_{CB}$ by more than $K(n_1, P-1)$, then $\sigma_1 = 0$ and more decoding is needed; if the index was exceeded by exactly $K(n_1, P-1)$, then the decoding is complete and all pulses are at $n_1$ with negative sign ($\sigma_1 = 1$); whereas, if the index was exceeded by less than $K(n_1, P-1)$, then $\sigma_1 = 1$ and further decoding is needed.

Now when further decoding is needed, again begin accumulating but restart at $I_1$. First accumulate $K(n_1, P-2)$ and then 2K(M, P−2) as M decreases from $n_1 - 1$ until the index $I_{CB}$ is again first equaled or exceeded; this picks out $n_2$: if accumulating $K(n_1, P-2)$ alone equals or exceeds the index, then $n_2 = n_1$ and $I_2 = 0$; otherwise $n_2 = M$. As previously, next determine $\sigma_2$ (and consequently, $I_2$) by whether $I_{CB}$ was exceeded by at least, exactly, or less than $K(n_2, P-2)$: if the accumulation exceeded the index by more than $K(n_2, P-2)$, then $\sigma_2 = 0$; if the index was exceeded exactly by $K(n_2, P-2)$, the decoding is complete and all remaining pulses are at $n_2$ with negative sign $\sigma_1 = 1$; whereas, if the index was exceeded by less than $K(n_1, P-1)$, $\sigma_2 = 1$.

Again, if the decoding is not complete, begin accumulating restarting from $I_1 + I_2$. First accumulate $K(n_2, P-3)$ and then 2K(M, P−3) as M decreases from $n_2 - 1$ until the index $I_{CB}$ is again first equaled or exceeded. And so forth; see FIG. 1c.

The following pseudocode demonstrates encoding p signed pulses at positions given by the (possibly repetitive) last p components of (p+1)-vector "pos" (the first component is set equal to n) and with plus/minus signs given by the 0/1s of the last p components of corresponding (p+1)-vector "sn" (the first component is set equal to 0) to yield index value "index". That is, pos(j+1)=$n_j$ and sn(j+1)=$\sigma_j$. The K(N,P) values are denoted k(n,p).

```
index = 0;      // initialization
for j=1:p       // compute I_js
    if (pos(j+1) < pos(j))
        if (j==1)    // I_1 does not have K(n_0,P-1) term
            index = index + 2*k(pos(j),p-j);
        else
            index = index + k(pos(j),p-j);
        end;
        for i=pos(j+1)+1:pos(j)-1
            index = index + 2*k(i,p-j);
        end;
    end;
    if (j==1 | pos(j+1)<pos(j))
        if (sn(j+1)==1)
            index = index + k(pos(j+1),p-j);
```

-continued

```
        end;
      end;
    end;
```

The following pseudocode demonstrates decoding, again using vectors "pos" and "sn", and again k(n,p) denotes the K(N,P):

```
pos = sn = 0;        // initialization
pos(1)=n;            // first component equal to N
sum=0;               // initialization
for j=1:p            // finding I_j and incrementing accum start
  if (sum==index)
    pos(j+1)=pos(j);
    sn(j+1)=sn(j);
  else
    for i=pos(j):-1:1
      tmp = k(i,j);
      sum = sum + 2*tmp;
      if (j<tmp & i==pos(j))
        sum = sum - tmp;
      end;
      if (sum>index)
        sum = sum - tmp;
        pos(j+1)=i;
        if (j>tmp & i==pos(i))
          sn(j+1)=sn(j);
        else
          if (sum > index)
            sum = sum - tmp;
            sn(j+1)=0;
          else
            sn(j+1)=1;
          end;
        end;
        break;
      end;
    end;
  end;
end;
```

Figure 1B:
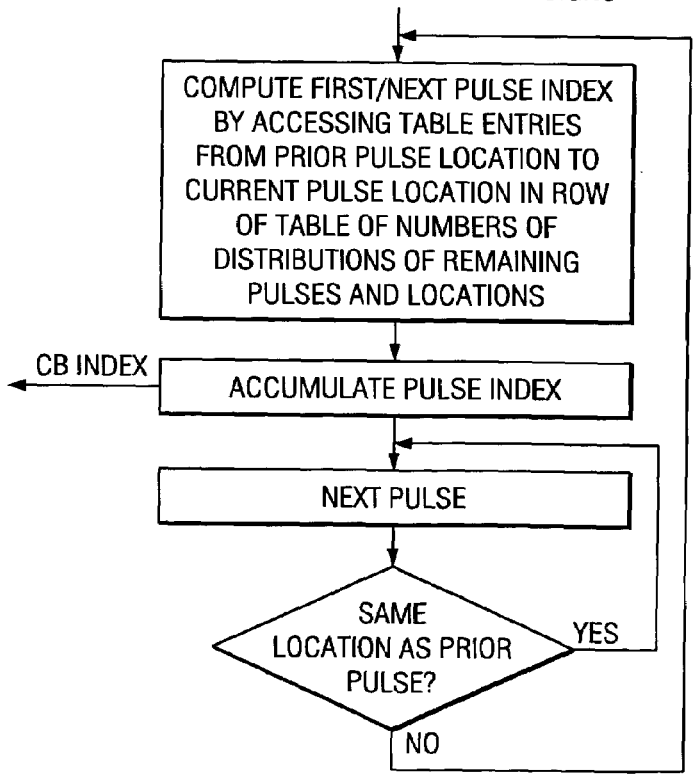
Figure 1C:
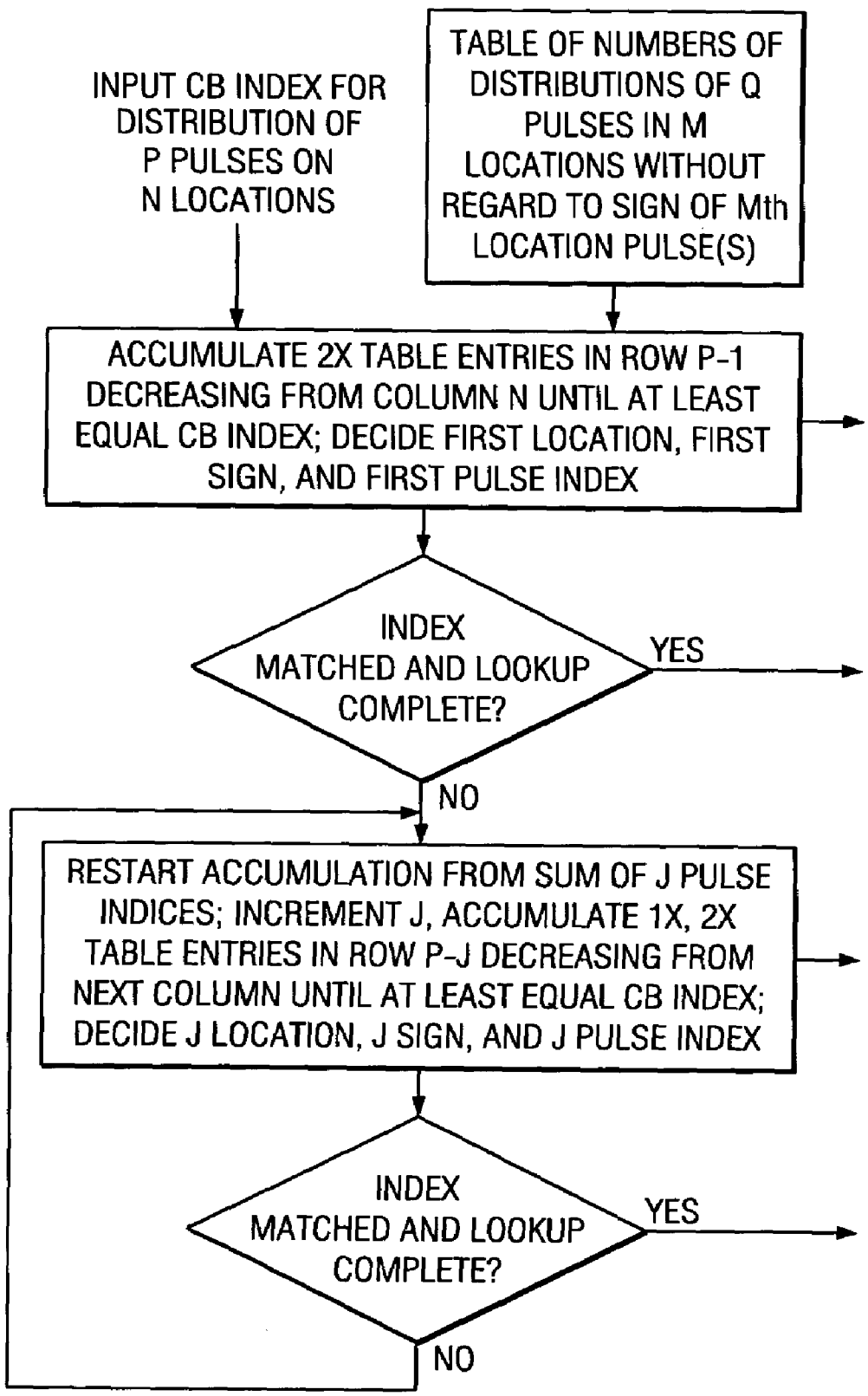
Figure 1D:
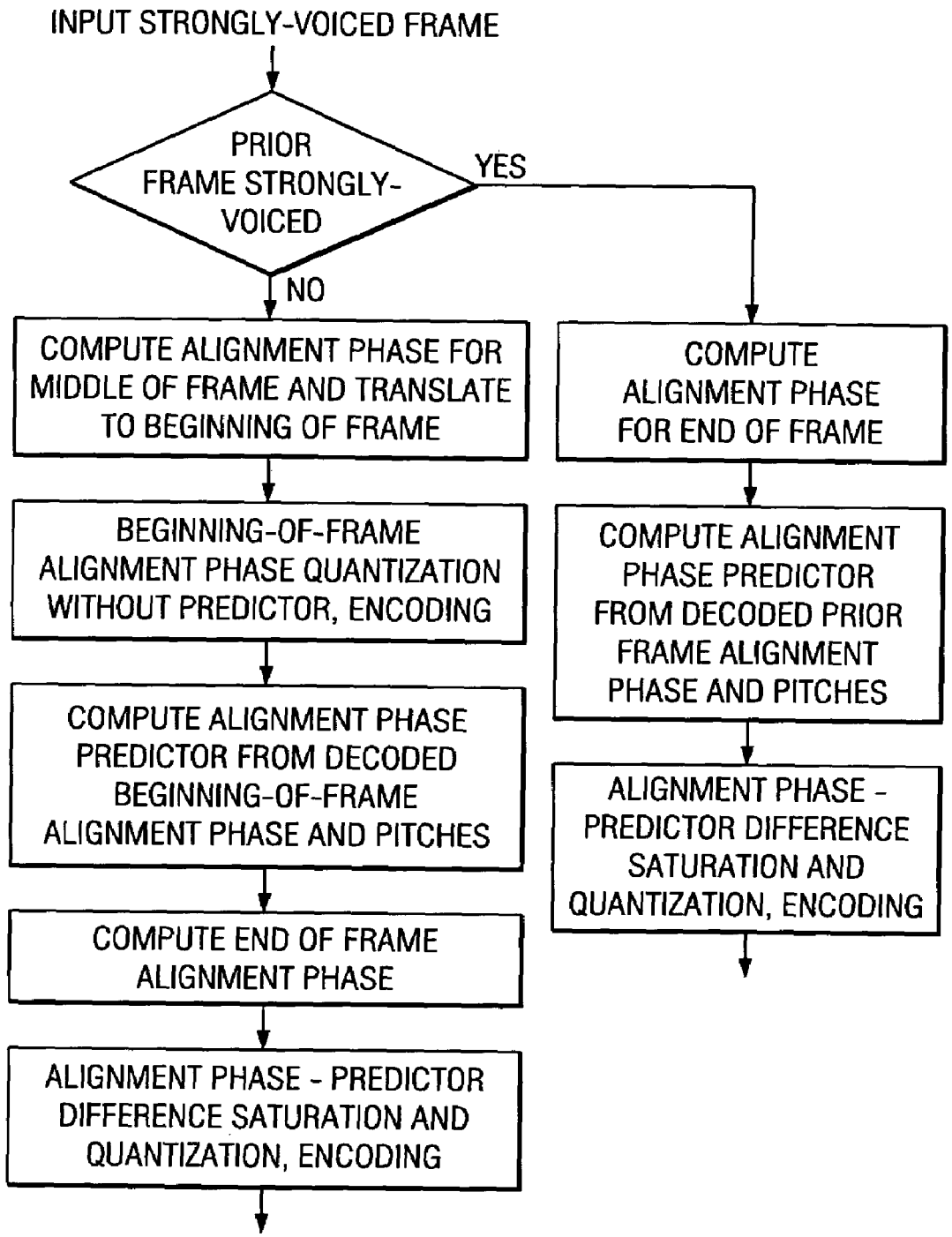
Figure 1E:
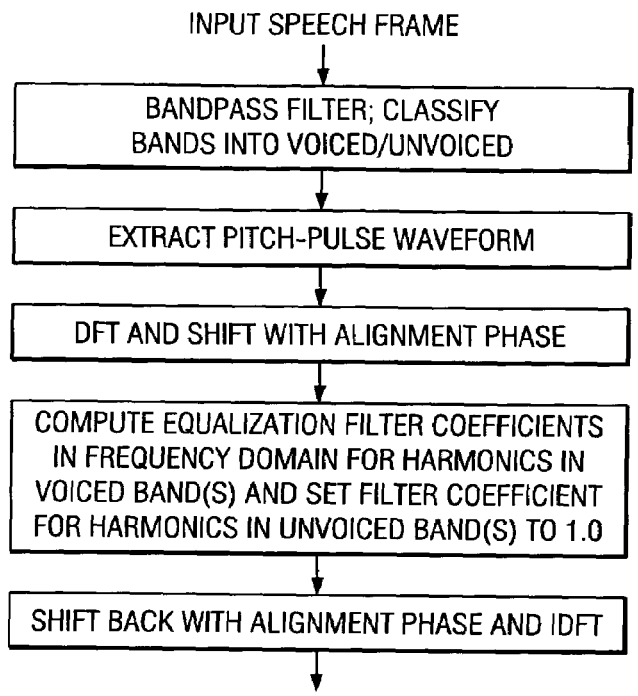

See FIGS. 1b-1c.

An alternative to storing a table of K(M,Q) values is to compute the needed values using simple recursions:

First, recall $L(M,Q) = \Sigma_i C(M,i) C(Q-1,i-1) 2^i$ for $1 \leq i \leq Q$ so $$K(N, P) = L(N-1, 0) + L(N-1, 1) +$$
$$L(N-1, 2) + \ldots + L(N-1, P)$$
$$= 1 + \sum_j \left( \sum_i C(N-1, i) C(j-1, i-1) 2^i \right) \text{ for } 1 \leq i \leq j$$
$$\text{and } 1 \leq j \leq P$$
$$= 1 + \sum_i C(N-1, i) 2^i \left( \sum_j C(j-1, i-1) \right) \text{ for } i \leq j \leq P$$
$$\text{and } 1 \leq i \leq P$$

Now for changing N, the values of $\Sigma_j C(j-1,i-1)$ are constant; and for changing P, the values of $C(N-1,i)2^i$ are constant. When calculating the K(N,P)s to use in the index computations, only the values corresponding to $C(N-1,i)2^i$ are updated in each of the pulse indices, $I_i$, computations, and changing from one pulse index to the next only updates $\Sigma_j C(j-1,i-1)$. These updatings can be done efficiently by taking advantage of the relationships between the binomials; namely, $C(N+1,P)=C(N,P)(N+1)/(N+1-P)$ and $C(N,P+1)=C(N,P)(N-P)/(P+1)$. In total, only $N+P-n_p$ values of K(M,Q) need to be computed by the encoder and the decoder (maximum N+P-1). There need be no more than N updates of the values corresponding to $C(N-1,i)2^i$ and no more than P-1 updates of the values corresponding to $\Sigma_j C(j-1,i-1)$. With each change from $I_i$ to $I_{i+1}$, the order of the summations is reduced by one further, which reduces the complexity.

5. Alignment Phase and Zero-Phase

The preferred embodiment hybrid coders of FIGS. 2a-2b include estimating and encoding "alignment phase" which can be used in the parametric decoder (e.g. MELP) to preserve time-synchrony between the input speech and the synthesized speech. In fact, for a strongly-voiced (sub)frame which invokes MELP coding, a pitch-period length interval of the residual centered at the end of the (sub)frame should include a single sharp pulse, and the alignment phase, $\phi_A$, is the added linear phase in the frequency domain which corresponds to time-shifting the pulse to the beginning of the pitch-period length interval. Indeed, the single pulse has both a position with respect to the interval and a shape; and the alignment phase essentially locates the pulse position while zero-phase equalization accounts for the pulse shape, as detailed in the following section.

Parametric decoders use the alignment phase to avoid artifacts due to phase discontinuity at the interface with synthesized speech from the waveform decoder (e.g., CELP) which inherently preserves time-synchrony. In particular, for MELP the LP excitation is generated as a sum of noisy and periodic excitations. The periodic part of the LP excitation is synthesized based on the interpolated Fourier coefficients (waveform) computed from the LP residual, and the alignment phase is the linear phase which best aligns these Fourier coefficients at (sub)frame boundaries. Fourier synthesis is applied to spectra in which the Fourier coefficients are placed at the harmonic frequencies derived from the interpolated fundamental (pitch) frequency. This synthesis is described by the formula $$x(t) = \Sigma_m X_t[m] e^{jm\phi(t)}$$

where $X_t[m]$ is the m-th Fourier coefficient (m-th harmonic) interpolated to time t. That is, at each end of a subframe, extract a pitch-pulse waveform (pitch-length portion of the residual) and apply the corresponding length DFT to obtain the harmonics $X_k[m]$ which are essentially quantized and encoded. The synthesis phase $\phi(t)$ is determined by the fundamental frequency $\omega(t)$ (reciprocal of the pitch) as $$\phi(t) = \phi(t-1) + \omega(t)$$

The fundamental frequency $\omega(t)$ could be calculated by linear interpolation of values encoded at the boundaries of the frame (or subframe). However, in preferred embodiment synthesis with the alignment-phase, $\phi_A$, apply quadratic interpolation to $\omega$ so that the fundamental phase $\phi(t)$ is equal to $\phi_{A,k}$ at the end of the k-th (sub)frame. The polynomial coefficients of the quadratic interpolation are calculated based on estimated fundamental frequency and alignment-phase at frame (subframe) boundaries.

The fundamental phase $\phi(t)$ being equal to $\phi_{A,k}$ at a frame boundary, the synthesized speech is time-synchronized with the input speech provided that no errors are made in the $\phi_A$ estimation. The synchronization is strongest at frame boundaries and may be weaker within a frame. This is not a problem as switching between the parametric and waveform coders is restricted to frame boundaries.

The sample-by-sample trajectory of the fundamental frequency ω is calculated from interpolating the frame boundary values of the fundamental frequency and the alignment phase, $\omega_k$ and $\phi_{A,k}$, respectively, which are encoded in terms of quantized pitch and quantized alignment phase. If the ω trajectory includes large variations, an audible distortion may be perceived. It is therefore important to maintain a smooth evolution of ω (within a frame and between frames). Within a frame, the most "smooth" trajectory of the fundamental frequency is obtained by linear interpolation of ω. In order to match the quantized values $\omega_{k,quant}$, $\phi_{A,k,quant}$, $\omega_{k+1,quant}$, and $\phi_{A,k+1,quant}$ at the subframe ends, the order of the interpolation polynomial for $\phi_A$ must be at least three (cubic) which means a quadratic interpolation for ω.

Considering the Fourier coefficients, presume a frame partitioned into subframes, and define $N_k$ to be the closest integer to the pitch period defined at the end of subframe k; thus $N_k$ varies through the frame when the pitch varies. Next, extract the LP residual, $x_k(n)$, in an interval of length $N_k$ centered at the end of subframe k using the corresponding (interpolated) LP coefficients; the variable n runs from 0 to $N_k-1$ and for notational convenience $x_k(n)$ may be defined for other n by periodicity. Note that the interval of length $N_k$ can be shifted a few samples to avoid the pitch pulse appearing at the interval boundaries, and such a shift can be compensated later. Then apply an $N_k$-point DFT to $x_k(n)$ to yield complex-valued harmonics $X_k[0], X_k[1], X_k[2], \ldots, X_k[N_k-1]$; so $X_k[0]$ is the dc component, $X_k[1]$ is the fundamental (pitch) frequency component, $X_k[2]$ is the second harmonic component, and so forth. Because $x_k(n)$ is real-valued, the harmonics have complex conjugate symmetry and only the first $N_k/2$ harmonics are needed; these harmonics define the frequency-domain complex-valued waveform which will be encoded using vector quantization.

Now if the pitch pulse of the residual $x_k(n)$ were a delta function pulse (presuming the amplitude is normalized by extracting a gain) and located somewhere in the interval of length $N_k$, then $|X_k[m]|=1$ for all m and the phase (modulo 2π) of $X_k[m]$ is a linear function of m with slope equal to the alignment phase $\phi_{A,k}$ and this locates the pulse. In particular, for $X_k[m]=\exp\{j(m\phi_{A,k})\}$:

$$x_k(n) = \sum_m X_k[m] \exp\{j2\pi mn/N_k\}$$
$$= \sum_m \exp\{j(2\pi mn/N_k + m\phi_{A,k})\}$$
$$= \sum_m \exp\{j(2\pi m(n-n_k)/N_k)\}$$
$$= \delta(n-n_k)$$

with $n_k$ defined by $n_k = -\phi_{A,k} N_k/2\pi$ and thus $n_k$ locates the pulse.

More generally, linear phase means $X_k[m]=|X_k[m]| \exp\{j(m\phi_{A,k})\}$, and because $x_k(n)$ is real-valued:

$$x_k(n) = \sum_m |X_k[m]| \exp\{j(2\pi mn/N_k + m\phi_{A,k})\}$$
$$= \sum_m |X_k[m]| \exp\{j(2\pi m(n-n_k)/N_k)\}$$
$$= \sum_m |X_k[m]| \cos(2\pi m(n-n_k)/N_k)$$

The pulse is thus located at $n=n_k$ ($n_k$ may be fractional) because all of the cos terms have a maximum there. And a parametric coder which encodes the harmonic magnitudes and the alignment phase will reconstruct this residual $x_k(n)$ exactly (within quantization error) and the resulting excitation will be synchronized with the excitation from a waveform coder.

However, phase is typically non-linear and this reflects pulse shape and affects audio perception, so extend the foregoing to the general as follows. First, the general real-valued residual in the interval is:

$$x_k(n) = \sum_m X_k[m] \exp\{j2\pi mn/N_k\}$$
$$= \sum_m |X_k[m]| \exp\{j(2\pi mn/N_k + \phi_k[m])\}$$
$$= \sum_m |X_k[m]| \cos(2\pi mn/N_k + \phi_k[m])$$

where $\phi_k[m]$ is the (total) phase of the mth harmonic (i.e., $X_k[m]=|X_k[m]| \exp\{j\phi_k[m]\}$) and is simply computed from $\cos(\phi_k[m])=\text{Re}\{X_k[m]\}/|X_k[m]|$ and $\sin(\phi_k[m])=\text{Im}\{X_k[m]\}/|X_k[m]|$. Next, find the pulse position (i.e., the alignment phase $\phi_{A,k}$) and then subtract the corresponding linear phase (multiples of the alignment phase) from the total phase for each harmonic; this rotates the harmonics in the complex plane and essentially shifts the pulse to n=0. The remaining phase relates to pulse shape, and the zero-phase equalization filtering described below accounts for this pulse shape.

Note that the alignment phase (pulse location) can be found in various ways: the simplest approach declares the location of the pulse to be at the peak value of the residual waveform (which has problems for asymmetric pulses) or at half the maximum of a self convolution (matched filtering). Alternatively, the alignment phase could be found in the frequency domain by a search to maximize the real part of the sum of the rotated harmonics or by a linear regression of $\phi_k[m]$ on m which minimizes $\Sigma_m (\phi_k[m]-m\phi_{A,k})^2$. Further approaches align the waveform with the (smoothed) aligned waveforms of prior subframes by cross-correlations to determine a relative alignment phase; that is, take as definition $\phi_{A,k}=\phi_{0,k}-\phi_{a,k}$ where $\phi_{a,k}$ generates the linear phase which aligns $x_k(n)$ to the previously-aligned (smoothed) waveform $x_{k-1}(n,a)$ and $\phi_{0,k}$ generates the linear phase which aligns the waveform created from only the magnitudes of the harmonics ($\Sigma_i|X_k[i]| \exp\{j2\pi in/N_k\}$) to the previously-aligned (smoothed) waveform $x_{k-1}(n,a)$. The smoothing can just be a weighted average over prior aligned waveforms. The advantage of this decomposition of the alignment phase lies in the robustness of aligning similar shapes (the smoothed previously-aligned waveforms and the harmonic magnitude only waveforms) because alignment just searches for the best cross-correlation.

In any case, find $\phi_{A,k}$ and then subtract from the corresponding linear phase from the total phase to yield the remaining (shape) phase: $\psi_k[m]=\phi_k[m]+m\phi_{A,k}$. The residual waveform may then be expressed as:

$$x_k(n) = \sum_m |X_k[m]| \exp\{j(2\pi mn/N_k + \phi_k[m])\}$$

$$= \sum_m |X_k[m]| \exp\{j(2\pi m(n-n_k)/N_k + \psi_k[m])\}$$

$$= \sum_m X_k^0[m] \exp\{j(2\pi m(n-n_k)/N_k)\}$$

where $X_k^0[m]=|X_k[m]| \exp\{j\psi_k[m]\}$ are the harmonics for the waveform after shifting by the alignment phase $\phi_{A,k}$ to put the pulse at n=0. That is, $x_k(n)$ is the shift by the alignment phase of $$x^0{}_k(n) = \Sigma_m X_k^0[m] \exp\{j2\pi mn/N_k\}$$

which has the same pulse shape as $x_k(n)$ but with pulse located at n=0 ("zero phase"). Waveform shifting in the frequency domain is directly computed by $$Re\{X_k^0[m]\} = \cos(\phi_{A,k}) Re\{X_k[m]\} - \sin(\phi_{A,k}) Im\{X_k[m]\}$$

$$Im\{X_k^0[m]\} = \sin(\phi_{A,k}) Re\{X_k[m]\} + \cos(\phi_{A,k}) Im\{X_k[m]\}.$$

Now the parametric (MELP) coder encodes $x_k(n)$ by the harmonic magnitudes $|X_k[m]|$ (quantized as a vector from a codebook) and quantized alignment phase $\phi_{A,k,quant}$, so decoding yields an excitation at subframe k end approximately equal to:

$$u_k(n) = \Sigma_m |X_k[m]| \exp\{j(2\pi m(n-n_k)/N_k)\}$$

That is, the shape information has been discarded and $u_k(n)$ is a shift of the excitation $u_k^0(n)$ which has a pulse at n=0:

$$u_k^0(n) = \Sigma_m |X_k[m]| \exp\{j2\pi mn/N_k\}$$

In contrast, decoding from a waveform (CELP) encoding yields an excitation approximating (by a quantized vector in a codebook) the original residual $x_k(n)$.

To avoid artifacts arising from the discontinuity in excitation pulse shape due to switching between waveform encoded frames and parametric encoded frames, the zero-phase equalization method filters the speech prior to residual extraction to yield modified speech which has waveforms like $u_k(n)$ rather than $x_k(n)$. In effect, zero-phase equalization filtering rotates $X_k^0[m]$ to $|X_k[m]|$ in the complex plane, which is the same as the mapping: $X_k[m] \to \exp\{-j\psi_k[m]\} X_k[m]$. Note that the pulse $u_k^0(n)$ is sharper than the original pulse $x_k^0(n)$ because all of the harmonic coefficients are positive at n=0 for $u_k^0(n)$, and the zero-phase equalization filtering sharpens the waveform pulses generally.

The equalization filtering can be expressed as time-domain filtering with filter impulse response $h_k(n)$ by taking the inverse DFT:

$$h_k(n) = \Sigma_m \exp\{-j\psi_k[m]\} \exp\{j2\pi mn/N_k\}$$

Note that $h_k(0)$ is the center of the filter response, but periodicity defines $h_k(n)$ for negative n, so define $h_k(n)$ in a single interval of length $N_k$ centered n=0 and extend to other n, if needed, by $h_k(n)=0$. Further, the $\exp\{-j\psi_k[m]\}$ factors can be simply found by using the aligned residual waveform $x_k^0(n)$ as $\cos(\psi_k[m]) = Re\{X_k^0[m]\}/|X_k^0[m]|$ and $\sin(\psi_k[m]) = -Im\{X_k^0[m]\}/|X_k^0[m]|$. Lastly, the filter coefficients $h_k(n)$ can be linearly interpolated in the k variable between (sub)frame ends to define a time domain filter $h_t(n)$ for all times. Thus the overall method has the following steps to compute the zero-phase equalization filter:

(a) extract LP residual waveform in pitch-length interval and normalize (extract gain); if the frame is unvoiced so no pitch will be determined, then set the filter to a delta pulse and go to the next frame.
(b) apply pitch-length DFT to waveform to find harmonics.
(c) find pitch pulse location in the waveform (alignment phase).
(d) shift waveform to n=0 (in frequency domain).
(e) normalize harmonics of shifted waveform to find zero-phase equalization filter coefficients in frequency domain; this defines a normalized waveform with modified pulse shape.
(f) shift normalized waveform back so modified pulse is in original pulse location.
(g) IDFT conversion of equalization filter coefficients to time domain filter coefficients.
(h) optionally, interpolate to define the equalization filter coefficients for times between the locations of the waveform extractions.

Apply the time-domain equalization filter to input speech to yield modified speech, and encode the modified speech. Alternatively, apply the equalization filter to the residual during encoding of the input speech.

6. Alignment Phase Coding Preferred Embodiments

The preferred embodiment alignment phase quantization for a current strongly-voiced frame which immediately follows a prior strongly-voiced frame invokes feedback prediction from the quantized pitch values for the current frame and prior frame plus the prior frame quantized alignment phase value to limit the allowed range for encoding. In particular, the preferred embodiment methods include the following steps (a)-(e) (details after the listing of the steps):

(a) compute an estimate (predictor) for the alignment phase at the end of the current frame as the quantized alignment phase at the end of the prior frame plus an adjustment computed from the encoded quantized pitch at the end of the prior frame and the encoded quantized pitch at the end of the current frame.
(b) compute the alignment phase at the end of the current frame by extracting the residual waveform in a quantized pitch-length interval followed by aligning the waveform with the decoded quantized waveform of the prior frame end.
(c) quantize and encode (codebook) the difference between the computed alignment phase at the end of the current frame from step (b) and the predicted alignment phase from step (a); the quantization is a search over the codebook values for minimum error; the number of codebook values depends upon the number of bits allocated.
(d) decode the encoded quantized difference from step (c) and add to the prior frame end quantized alignment phase to yield the current frame end quantized alignment phase.
(e) shift the extracted waveform of step (b) using the quantized alignment phase from step (d); this shifted waveform will be the target for the next frame alignment phase.

Note that the alignment-phase $\phi_A$ could be encoded for each frame directly with a uniform quantizer between $-\pi$ and $\pi$. However, the difference between the alignment phase and the estimated alignment phase likely can be encoded with a uniform quantizer in a smaller range, such as $-\pi/4$ to π/4 which corresponds to a two-bit saving with respect to a full range quantizer (−π to π) with the same precision.

In more detail, first consider how alignment phase depends upon location of the pitch-length interval; that is, how the alignment phases of the residual in two different pitch-length intervals differ. Initially presume a constant pitch period of integral length $N_0$ in a frame partitioned into subframes of length M. When a residual in a length $N_0$ interval centered at the end of subframe k has its pulse in common with the residual in a length $N_0$ interval centered at the end of subframe k+1, then the pulse locations are simply related by $n_{k+1}=n_k-M$. This translates into $\phi_{A,k+1}=\phi_{A,k}-2\pi M/N_0 \pmod{2\pi}$. Because the pitch period is constant, this relation extends to non-adjacent subframes: $\phi_{A,k+m}=\phi_{A,k}-2\pi mM/N_0 \pmod{2\pi}$. Note that this can be interpreted as $\phi_{A,k+m}=\phi_{A,k}-mM\omega_0 \pmod{2\pi}$ where the fundamental frequency, ω, is defined as the reciprocal of the pitch; so in this case: $\omega_0=2\pi/N_0$. Now if the pitch period changes and/or is fractional, then using an average fundamental frequency gives a good approximation: $\phi_{A,k+m}\cong\phi_{A,k}-mM(\omega_{k+m}+\omega_k)/2 \pmod{2\pi}$ where $\omega_{k+m}\cong 2\pi/N_{k+m}$ and $\omega_k\cong 2\pi/N_k$.

Thus foregoing step (a) in a frame of K subframes, each of length M, is $\phi_{A,K,pred}=\phi_{A,0,quant}-KM(\omega_{K,quant}+\omega_{0,quant})/2 \pmod{2\pi}$ where $\phi_{A,K,pred}$ is the predicted (estimated) alignment phase at the end of the frame, $\phi_{A,0,quant}$ is the quantized and encoded alignment phase for the end of the prior frame (beginning of the current frame) and $\phi_{0,quant}$ and $\phi_{K,quant}$ are the (quantized) fundamental frequencies (reciprocals of the quantized and encoded pitches) at the beginning and end of the frame, respectively. The step (c) difference encoding may use 4 bits with a resolution of π/32 and a (search) range of −π/4 to π/4; this compares to 6 bits encoding of the alignment phase over the full range −π to π without using difference from a predicted (estimated) value.

Continuing with a frame of K subframes, each of length M, foregoing step (b) proceeds to extract the residual waveform, $x_K(n)$, in an interval of length $N_{K,quant}$ centered at the end of the subframe K (again, the interval may be offset a few samples to avoid a pulse at the interval boundaries). Then find the alignment phase $\phi_{A,K}$ by the previously-described method using the decomposition $\phi_{A,k}=\phi_{0,k}-\phi_{a,k}$ where the shift of foregoing step (e) will be the part of the target for alignment to find $\phi_{a,k}$.

For a strongly-voiced frame which follows either a weakly-voiced or an unvoiced frame, preferred embodiments encode a second alignment phase for the beginning of the strongly-voiced frame. That is, encode an alignment phase for both the beginning and the end of an initial strongly-voiced frame. The alignment phase at the beginning of the frame is quantized and encoded (using a predictor of 0.0); whereas, the alignment phase at the end of the frame has the usual differential encoding using the quantized alignment phase at the beginning of the frame translated to the end of the frame as the predictor. The extra bits for the encoding the alignment phase at the beginning of the frame come from bit savings from other parameters. For example, the bandpass voicing bits may be reduced from 3 to 1. Indeed, the difference encoding of the alignment phase of step (c) saves bits in general, and these bits have been allocated to other parameters; then in the case of an initial strongly-voiced frame these bits are reallocated to the alignment phase.

Such an encoding of the alignment phase at the beginning of an initial parametric-encoded (strongly-voiced) frame in addition to the usual encoding of the alignment phase at the end of the frame has advantages including lessening discontinuity artifacts because a prior weakly-voiced (waveform encoded) frame will have a (not encoded) alignment phase for its waveform at the end of the frame, and this alignment phase can be used in determining alignment phase for the beginning of the strongly-voiced frame.

Two cases arise: a strongly-voiced frame may immediately follow a weakly-voiced frame or it may immediately follow an unvoiced frame. First consider the case of encoding a current strongly-voiced frame following a weakly-voiced frame; the preferred embodiment proceeds as:

(a) translate the (not encoded) alignment phase for the end of the prior weakly-voiced frame, $\phi_{A,WV}$, to the middle of the current frame using the pitch for the middle of the current frame for the translation; this provides an estimate for the alignment phase to be extracted in step (b); explicitly, $\phi_{A,mid,pred}=\phi_{A,WV}+M\omega_{mid}/2 \pmod{2\pi}$ where $\omega_{mid}$ is the middle of the frame fundamental frequency (reciprocal of the pitch) and the frame has M samples.

(b) extract the pitch-pulse waveform at the middle of the current frame and compute the alignment phase for the middle of the frame, $\phi_{A,mid}$, by one of the previously-described methods (e.g., best-fit linear phase) which may use the estimate $\phi_{A,mid,pred}$ from step (a).

(c) translate the alignment phase from step (b) to the beginning of the current frame using the pitch at the middle of the current frame for the translation: $\phi_{A,0}=\phi_{A,mid}-M\omega_{mid}/2 \pmod{2\pi}$.

(d) compare $\phi_{A,0}$ and $\phi_{A,WV}$, and if there is little difference (less than four times the alignment phase quantization resolution), substitute $\phi_{A,WV}$ as the alignment phase $\phi_{A,0}$ for the beginning of the current frame.

(e) quantize and encode $\phi_{A,0}$ from the precding step.

(f) shift the waveform extracted in step (b) in the frequency domain by $\phi_{A,mid}$ from step (b); the shifted waveform will be the alignment target for the waveform extracted for the end of current frame.

(g) predict the alignment phase at the end of the current frame by $\phi_{A,end,pred}=\phi_{A,mid}-M(\omega_{mid}+\omega_{end})/4 \pmod{2\pi}$ where $\omega_{mid}$ and $\omega_{end}$ are the middle and end of the frame fundamental frequencies, respectively. p1 (h) extract a pitch-pulse waveform at the end of the current frame and computer the alignment phase, $\phi_{A,end}$, for this waveform using the $\phi_{A,end,pred}$ predictor from step (g).

(i) using the quantized alignment phase $\phi_{A,0,quant}$ for the beginning of the frame from step (e), compute a decodable predictor for the alignment phase at the end of the current frame by $\phi_{A,end,quant-pred}=\phi_{A,0,quant}-M\omega_{end,quant}/2 \pmod{2\pi}$ where $\omega_{end,quant}$ is the quantized fundamental frequency at the end of the current frame; that is, $\phi_{A,end,quant-pred}$ is computed from quantities which are available at the decoder and thus can be used as the predictor for quantization and encoding.

(j) quantize and encode the difference $\phi_{A,end}-\phi_{A,end,quant-pred}$; this is the encoding for the alignment phase for the end of the frame; that is, $\phi_{A,end,quant}=\phi_{A,end,quant-pred}+\text{encoded difference}$.

(k) shift the waveform extracted in step (h) in the frequency domain by $\phi_{A,end,quant}$ from step (j); the shifted waveform will be the alignment target for the waveform extracted for the next frame.

(l) lastly, set the quantized pitch for the beginning of the current frame (end of prior frame) to be consistent with the quantized alignment phases for the beginning and end of the current frame from steps (e) and (j) and the quantized pitch for the end of the current frame from step (i).

For encoding a strongly-voiced frame immediately following an unvoiced frame, modify the foregoing steps (a)-(l) because the unvoiced frame has a stochastic waveform encoded and no pitch or alignment phase at frame end. In particular, omit step (a); use a predictor of. 0.0 in step (b); and omit step (d).

7. Zero-Phase Equalization Filter Preferred Embodiments

In a frame for which the CELP coder is chosen, equalized speech is used as the target for generating synthesized speech. Equalization filter coefficients are derived from pitch-length segments of the LP residual. The pitch values vary from about 2.5 ms to over 16 ms (i.e., 18 to 132 samples). The pitch-length waveforms are aligned in the frequency domain and smoothed over time. The smoothed pitch-waveforms are circularly shifted so that the waveform energy maxima are in the middle. The filter coefficients are generated by extending the pitch-waveforms with zeros so that the middle of the waveform corresponds to the middle filter coefficient. The number of added zeros is such that the length of the equalization filter is equal to maximum pitch-length. With this approach, no delay is observed between the original and zero-phase-equalized signal. The filter coefficients are calculated once per 20 ms (160 samples) frame and interpolated for each 2.5 ms (20 samples) subframe. For unvoiced frames, the filter coefficients are set to an impulse so that the filtering has no effect in unvoiced regions (except for the unvoiced frame for which the filter is interpolated from non-impulse coefficients). The filter coefficients are normalized; that is, the gain of the filter is set to one.

Generally, the zero-phase equalized speech has a property of being more "peaky" than the original. For the voiced part of speech encoded with a codebook containing fixed number of pulses (e.g. algebraic codebook), the reconstructed-signal SNR was observed to increase when the zero-phase equalization was used. Thus the preferred embodiment zero-phase equalization could be useful as a preprocessing tool to enhance performance of some CELP-based coders.

An alternative preferred embodiment applies the zero-phase equalization directly on speech rather than on the LP residual.

The foregoing zero-phase equalization filter has ambiguous behavior from harmonics which fall into unvoiced frequency bands because such harmonics typically have small magnitudes and thus the $\cos(\psi_k[m])$ and $\sin(\psi_k[m])$ are ratios of small numbers. Therefore the preferred embodiment methods proceed as follows: first, bandpass filter the input speech into frequency bands, such as the five bands 0-500 Hz, 500-1000 Hz, 1000-2000 Hz, 2000-3000 Hz, and 3000-4000 Hz; next, assess the voicing level (strength of periodicity) for each band of the speech (such as by correlation magnitudes); and then classify the bands as voiced or unvoiced. This decomposition into bands of speech may be used in formation of the excitation (i.e., MELP), such as each band provides a component for the excitation with unvoiced bands only providing noise (in the band), whereas voiced bands have both pitch and noise contributions.

More explicitly, evaluate the bandpass voicing levels using a 264-sample interval covering the 160-sample frame plus 40 samples from the look-ahead frame and 64 samples from the prior frame. After filtering into the five frequency bands, partition the 264 filtered samples in each band into six 44-sample subintervals. That is, there are 30 44-sample signals, $s[j,k](n_k)$, where $j=0,1,\ldots,4$ denotes the frequency band, $k=1, 2, \ldots, 6$ denotes the subinterval, and the sample variable $n_k=0,1,\ldots,43$ within the kth subinterval; $s[j,k](n_k)$ for negative values of the variable extends into the jth band of preceding subintervals. Next, compute the sum over subintervals of frequency band cross-correlations to define the bandpass voicing levels for the frame:

$$bpvc[j] = \Sigma_{1 \le k \le 6} \{\Sigma_{0 \le n \le 43} s[j,k](n_k) \, s[j,k](n_k - p_k) / \Sigma_{0 \le n \le 43} s[j,k](n_k)^2\}$$

where $p_k$ is the pitch period for the end of the kth subinterval and $s[j,k](n_k-p_k)$ is an interpolated value if $p_k$ is fractional.

The preferred embodiment zero-phase equalization filter and method adjusts the filter coefficients to reflect the bandpass voicing level of the band into which a harmonic falls. In particular, when the frequency of $8000 \, m/N_k$ Hz lies in a band with voicing level greater than a threshold such as 0.85, then the term $\exp\{j\psi_k[m]\}\exp\{j2\pi mn/N_k\}$ is included in the inverse DFT sum defining $h_k(n)$; whereas, when $8000 \, m/N_k$ Hz lies in a band with voicing level not greater than the threshold, then the term $\exp\{j\psi_k[m]\}\exp\{j2\pi mn/N_k\}$ is replaced by the term $\exp\{j2\pi mn/N_k\}$ in the inverse DFT sum. That is, the shape phase $\psi_k[m]$ is ignored (set equal to 0). Thus the preferred embodiment zero-phase equalization filter impulse response is:

$$h_k(n) = \sum_{m \in threshold} \exp\{-j\psi_k[m]\} \exp\{j2mn/N_k\} + \sum_{m \notin threshold} \exp\{j2mn/N_k\}$$

The $\psi_k[m]$ are found as previously described. (Note that if all of the bands are unvoiced, then the filter is the IDFT of all harmonics equal to 1.0 which is a delta pulse at n=0.) In summary, the preferred embodiment zero-phase equalization filter construction includes the following steps:

(a) apply bandpass filtering to input frame of speech and determine bandpass voicing level (bpvc[j]) for each frequency band j in the frame; declare the jth frequency band as voiced if bpvc[j] exceeds the threshold and unvoiced otherwise.

(b) if the frame is unvoiced, then set the zero-phase equalization filter to a delta pulse and go to the next frame; else extract pitch-pulse waveform(s) at the (sub) frame end and normalize (factor out gain).

(c) apply DFT to pitch-pulse waveform to find harmonics.

(d) shift the waveform (applying linear alignment phase $m\phi_A$ to mth harmonic in the frequency domain) so pulse is at n=0.

(e) replace each aligned harmonic from step (d) which either lies in an unvoiced frequency band or equals 0.0 with 1.0 (real part equal 1.0 and imaginary part equal 0.0), and normalize (divide by its magnitude) each non-zero aligned harmonic from step (d) which lies in an voiced frequency band (the 1.0 replacement harmonics are automatically normalized); these normalized aligned harmonics define a normalized waveform which has a pulse somewhat like that of the original waveform and located about n=0.

(f) shift the normalized waveform from step (e) to restore the pulse location by applying linear phase $-m\phi_A \, p/N$ to mth normalized harmonic in frequency domain; the p/N factor compensates for non-integer pitch; this is the frequency domain version of the zero-phase equalization filter.

(g) apply inverse DFT to the shifted normalized waveform from step (f) to convert frequency domain filter coefficients to time domain filter coefficients.

(h) optionally, interpolate to define the filter coefficients for times between the locations of the step (b).

This preferred embodiment equalization filter has the advantages including better matching of the modified speech waveform pulse shape to the pulse shape synthesized by parametric coding.

An alternative replaces harmonics with $|X_k[m]|<0.85$ by $X_k[m]=1.0$.

8. Decoding with Alignment Phase

The decoding using alignment phase can be summarized as follows (with the quantizations by the codebooks ignored for clarity). For time t between the ends of subframes k and k+1 (that is, time t is in subframe k+1), the synthesized periodic part of the excitation if the phase were coded would be a sum over harmonics:

$$u(t)=\Sigma X_t[m]e^{jm\phi(t)}$$

with $X_t[m]$ the mth Fourier coefficient (harmonic) interpolated for time t from $X_k[m]$ and $X_{k+1}[m]$ where $X_k[m]$ is the mth Fourier coefficient of pitch-pulse waveform $x_k$ and $X_{k+1}[m]$ is the m-th Fourier coefficient of pitch-pulse waveform $X_{k+1}$ and $\phi(t)$ is the fundamental phase interpolated for time t from $\phi_k$ and $\phi_{k+1}$ where $\phi k$ is the fundamental phase derived from $x_k$ (i.e., $\phi_k[1]$) and $\phi_{k+1}$ is the fundamental phase derived from $x_{k+1}$.

However, for the preferred embodiments which encode only the magnitudes of the harmonics, only $|X_t[m]|$ is available and is interpolated for time t from $|X_k[m]|$ and $|X_{k+1}[m]|$ which derive from u(0,k) and u(0,k+1), respectively. In this case the synthesized periodic portion of the excitation would be:

$$x(t)=\Sigma|X_t[m]|\exp\{jm\phi_A(t)\}$$

where $\phi_A(t)$ is the alignment phase interpolated for time t from alignment phases $\phi_{A,k}$ and $\phi_{A,k+1}$.

9. Modifications

The preferred embodiments can be modified in various ways while retaining one or more of the features of mid-frame LSF interpolation coefficients from allocated bits, ordered algebraic codebook indexing, second alignment phase of initial frame on switch, and/or zero-phase equalization with.

For example, varying numerical parameters such as frame size, subframe number, order of the LP filter, encoded filter coefficient form (LSF) subset partitioning for interpolation sets, error minimization functions and weightings, codebook sizes, and so forth.

What is claimed is:

1. A method of encoding speech, comprising:
   (a) encoding speech frames of a first mode with waveform coefficients; and
   (b) encoding speech frames of a second mode with magnitudes of waveform coefficient plus an alignment phase;
   (c) wherein said encoding of step (b) includes a second alignment phase for a frame of said second mode immediately following a frame of said first mode.

2. The method of claim 1, wherein:
   (a) said alignment phase of step (b) of claim 1 corresponds to the ends of said frames of said second mode; and
   (b) said second alignment phase of step (c) of claim 1 corresponds to the beginning of said frame of said second mode immediately following said frame of said first mode.

* * * * *